US006845901B2

(12) United States Patent
Koopmans

(10) Patent No.: US 6,845,901 B2
(45) Date of Patent: Jan. 25, 2005

(54) APPARATUS AND METHOD FOR DEPOSITING AND REFLOWING SOLDER PASTE ON A MICROELECTRONIC WORKPIECE

(75) Inventor: Michel Koopmans, Boise, ID (US)

(73) Assignee: Micron Technology, Inc., Boise, ID (US)

(*) Notice: Subject to any disclaimer, the term of this patent is extended or adjusted under 35 U.S.C. 154(b) by 41 days.

(21) Appl. No.: 10/226,509

(22) Filed: Aug. 22, 2002

(65) Prior Publication Data

US 2004/0035917 A1 Feb. 26, 2004

(51) Int. Cl.⁷ ............................................. B23K 31/02
(52) U.S. Cl. ....................................................... 228/248.1
(58) Field of Search ............................ 228/248.1, 248.5, 228/180.22, 41, 22, 23; 219/85.13, 121.66; 427/96

(56) References Cited

U.S. PATENT DOCUMENTS

| 5,128,831 A |   | 7/1992  | Fox, III et al.       |         |
|-------------|---|---------|----------------------|---------|
| 5,539,153 A | * | 7/1996  | Schwiebert et al.    | 174/260 |
| 5,593,927 A |   | 1/1997  | Farnworth et al.     |         |
| 5,677,566 A |   | 10/1997 | King et al.          |         |
| 5,782,399 A | * | 7/1998  | Lapastora            | 228/41  |
| 5,851,845 A |   | 12/1998 | Wood et al.          |         |
| 5,891,797 A |   | 4/1999  | Farrar               |         |
| 5,921,462 A | * | 7/1999  | Gordon               | 228/191 |
| 5,933,713 A |   | 8/1999  | Farnworth            |         |
| 5,946,553 A |   | 8/1999  | Wood et al.          |         |
| 5,986,209 A |   | 11/1999 | Tandy                |         |
| 5,988,487 A | * | 11/1999 | MacKay et al.        | 228/254 |
| 5,990,566 A |   | 11/1999 | Farnworth et al.     |         |
| 6,004,867 A |   | 12/1999 | Kim et al.           |         |
| 6,008,070 A |   | 12/1999 | Farnworth            |         |
| 6,011,314 A | * | 1/2000  | Leibovitz et al.     | 257/781 |
| 6,018,249 A |   | 1/2000  | Akram et al.         |         |
| 6,020,624 A |   | 2/2000  | Wood et al.          |         |
| 6,048,755 A |   | 4/2000  | Jiang et al.         |         |
| 6,072,233 A |   | 6/2000  | Corisis et al.       |         |
| 6,072,236 A |   | 6/2000  | Akram et al.         |         |
| 6,081,429 A |   | 6/2000  | Barrett              |         |
| 6,089,920 A |   | 7/2000  | Farnworth et al.     |         |
| 6,097,087 A |   | 8/2000  | Farnworth et al.     |         |
| 6,107,122 A |   | 8/2000  | Wood et al.          |         |
| 6,112,975 A | * | 9/2000  | Lapastora            | 228/248.1 |

(List continued on next page.)

Primary Examiner—Kiley S. Stoner
(74) Attorney, Agent, or Firm—Perkins Coie LLP

(57) ABSTRACT

Stenciling machines and methods for forming solder balls on microelectronic workpieces are disclosed herein. In one embodiment, a method for depositing and reflowing solder paste on a microelectronic workpiece having a plurality of dies includes positioning a stencil having a plurality of apertures at least proximate to the workpiece. The method further includes placing discrete masses of solder paste into the apertures and reflowing the discrete masses of solder paste while the stencil is positioned at least proximate to the workpiece and while the discrete masses are in the apertures. In another embodiment of the invention, a stenciling machine for depositing and reflowing solder paste on the microelectronic workpiece includes a heater for reflowing the solder paste, a stencil having a plurality of apertures, and a controller operatively coupled to the heater and the stencil. The controller has a computer-readable medium containing instructions to perform the above-mentioned method.

58 Claims, 7 Drawing Sheets

U.S. PATENT DOCUMENTS

| | | | |
|---|---|---|---|
| 6,124,634 | A | 9/2000 | Akram et al. |
| 6,126,059 | A * | 10/2000 | MacKay et al. ............... 228/9 |
| 6,130,474 | A | 10/2000 | Corisis |
| 6,148,509 | A | 11/2000 | Schoenfeld et al. |
| 6,150,717 | A | 11/2000 | Wood et al. |
| 6,173,887 | B1 * | 1/2001 | Mead et al. ............. 228/248.1 |
| 6,184,465 | B1 | 2/2001 | Corisis |
| 6,187,615 | B1 | 2/2001 | Kim et al. |
| 6,188,232 | B1 | 2/2001 | Akram et al. |
| 6,201,304 | B1 | 3/2001 | Moden |
| 6,214,716 | B1 | 4/2001 | Akram |
| 6,225,689 | B1 | 5/2001 | Moden et al. |
| 6,228,687 | B1 | 5/2001 | Akram et al. |
| 6,232,666 | B1 | 5/2001 | Corisis et al. |
| 6,235,552 | B1 | 5/2001 | Kwon et al. |
| 6,239,489 | B1 | 5/2001 | Jiang |
| 6,247,629 | B1 | 6/2001 | Jacobson et al. |
| 6,258,623 | B1 | 7/2001 | Moden et al. |
| 6,265,766 | B1 | 7/2001 | Moden |
| 6,281,042 | B1 | 8/2001 | Ahn et al. |
| 6,285,204 | B1 | 9/2001 | Farnworth |
| 6,310,390 | B1 | 10/2001 | Moden |
| 6,326,697 | B1 | 12/2001 | Farnworth |
| 6,326,698 | B1 | 12/2001 | Akram |
| 6,329,222 | B1 | 12/2001 | Corisis et al. |
| 6,331,221 | B1 | 12/2001 | Cobbley |
| 6,344,401 | B1 * | 2/2002 | Lam ......................... 438/460 |
| 6,407,381 | B1 | 6/2002 | Glenn et al. |
| 6,503,780 | B1 | 1/2003 | Glenn et al. |
| 6,523,736 | B1 * | 2/2003 | Farnworth .................. 228/254 |
| 6,577,008 | B2 * | 6/2003 | Lam et al. .................. 257/750 |
| 6,664,176 | B2 * | 12/2003 | Hedler et al. ............... 438/614 |
| 2003/0088974 | A1 * | 5/2003 | Nakamura et al. ............ 29/740 |
| 2003/0167633 | A1 * | 9/2003 | Rutiser ........................ 29/841 |
| 2003/0176014 | A1 * | 9/2003 | Hofmann ................... 438/106 |
| 2003/0207574 | A1 * | 11/2003 | Aiba et al. .................. 438/689 |
| 2003/0218261 | A1 * | 11/2003 | Capote et al. ............. 257/787 |

\* cited by examiner

APPARATUS AND METHOD FOR DEPOSITING AND REFLOWING SOLDER PASTE ON A MICROELECTRONIC WORKPIECE

TECHNICAL FIELD

The present invention relates to an apparatus and method for depositing and reflowing solder paste on a microelectronic workpiece.

BACKGROUND

Microelectronic devices are used in cell phones, pagers, personal digital assistants, computers and many other products. A packaged microelectronic device can include a microelectronic die, an interposer substrate or lead frame attached to the die, and a molded casing around the die. The microelectronic die generally has an integrated circuit and a plurality of bond-pads coupled to the integrated circuit. The bond-pads are coupled to terminals on the interposer substrate or lead frame. The interposer substrate can also include ball-pads coupled to the terminals by traces in a dielectric material. An array of solder balls is configured so that each solder ball contacts a corresponding ball-pad to define a "ball-grid" array. Packaged microelectronic devices with ball-grid arrays generally have lower profiles and higher pin counts than conventional chip packages that use a lead frame.

Packaged microelectronic devices are typically made by (a) forming a plurality of dies on a semiconductor wafer, (b) cutting the wafer to singulate the dies, (c) attaching individual dies to an interposer substrate, (d) wire-bonding the bond-pads to the terminals of the interposer substrate, and (e) encapsulating the dies with a molding compound. It is time consuming and expensive to mount individual dies to interposer substrates. Also it is time consuming and expensive to wire-bond the bond-pads to the interposer substrate and then encapsulate the individual dies. Therefore, packaging processes have become a significant factor in producing semiconductor and other microelectronic devices.

Another process for packaging devices is wafer-level packaging. In wafer-level packaging, a plurality of dies is formed on a wafer and then a redistribution layer is formed on top of the dies. The redistribution layer has a dielectric layer, a plurality of ball-pad arrays on the dielectric layer, and traces coupled to individual ball-pads of the ball-pad arrays. Each ball-pad array is arranged over a corresponding die, and the ball-pads in each array are coupled to corresponding bond-pads on a die by the traces in the redistribution layer. After forming the redistribution layer on the wafer, a highly accurate stenciling machine deposits discrete blocks of solder paste onto the ball-pads of the redistribution layer to form solder balls.

The stenciling machine generally has a stencil and a wiper mechanism. The stencil has a plurality of holes configured in a pattern corresponding to the ball-pads on the redistribution layer. The wiper mechanism has a wiper blade attached to a movable wiper head that moves the wiper blade across the top surface of the stencil. In operation, a volume of solder paste is placed on top of the stencil along one side of the pattern of holes. A first microelectronic workpiece is then pressed against the bottom of the stencil and the wiper blade is moved across the stencil to drive the solder paste through the holes and onto the first microelectronic workpiece. The solder paste deposited on the microelectronic workpiece forms small solder paste bricks on each ball-pad. The first microelectronic workpiece is then removed from the bottom of the stencil, and the process is repeated for other microelectronic workpieces that have the same pattern of ball-pads.

After forming the solder paste bricks on the ball-pads, the microelectronic workpiece is transferred to a reflow oven. The entire microelectronic workpiece is heated in the oven to reflow the solder (i.e., to vaporize the flux and form solder balls from the solder paste bricks). The reflow process creates both a mechanical and electrical connection between each solder ball and the corresponding ball-pad after the reflowed solder has cooled and solidified.

Conventional solder printing equipment and processes, however, have several drawbacks. For example, after the microelectronic workpiece is removed from the stencil, residual solder paste may remain in the holes of the stencil. The residual solder paste can cause inconsistencies in the size and shape of the deposited solder paste bricks. For example, when the process is repeated with residual solder paste in the holes, an insufficient volume of solder paste may be placed onto the ball-pads of the subsequent microelectronic workpiece. This may create solder balls that are too small for attachment to another device. Additionally, the volume of the residual solder paste may vary across the stencil. This results in different sizes of solder paste bricks across the workpiece, which produces different sizes of solder balls.

Another drawback of conventional processes is that solder paste can be smeared while the microelectronic workpiece is moved from the stenciling machine to the reflow oven. Even if the solder paste is not smeared, when the pitch between the solder paste bricks is small, the solder paste on several ball-pads may bridge together after the microelectronic workpiece is removed from the stencil. Accordingly, a new stenciling machine and a new method for applying solder paste to microelectronic workpieces is needed to improve wafer level packaging processes.

SUMMARY

The present invention is directed to stenciling machines and methods for forming solder balls on microelectronic workpieces. One aspect of the invention is directed to a method for depositing and reflowing solder paste on a microelectronic workpiece having a plurality of microelectronic dies. In one embodiment, the method includes positioning a stencil having a plurality of apertures at least proximate to the workpiece and placing discrete masses of solder paste into the apertures. The method further includes reflowing the discrete masses of solder paste while the stencil is positioned at least proximate to the workpiece and while the discrete masses are in the apertures. In one aspect of this embodiment, the discrete masses of solder paste can be placed into the apertures and proximate to bond-pads of the dies or ball-pads in or on a redistribution layer of the microelectronic workpiece. In a further aspect of this embodiment, reflowing the solder paste can include heating the solder paste with infrared light, a laser, a gas, or another device to reflow the solder paste. The heating device can be movable relative to the stencil or stationary, such as a heating device having heating elements in the stencil or in a microelectronic workpiece holder.

In another embodiment of the invention, a method for forming solder balls on the microelectronic workpiece includes placing solder paste into the plurality of apertures in the stencil. The apertures in the stencil are aligned with corresponding ball-pads or bond-pads of the microelectronic workpiece. The method further includes forming solder balls within the apertures and on the ball-pads or bond-pads. In a further aspect of this embodiment, forming solder balls can include heating the solder paste in the apertures through convection. In another aspect of this embodiment, placing solder paste can include wiping solder paste across the stencil in a first direction to press discrete portions of the solder paste into the apertures. In a further aspect of this embodiment, the method can also include separating the microelectronic workpiece from the stencil after forming the solder balls.

Another aspect of the invention is directed to a stenciling machine for depositing and reflowing solder paste on the microelectronic workpiece. In one embodiment, the stenciling machine includes a heater for reflowing the solder paste, a stencil having a plurality of apertures, and a controller operatively coupled to the heater and the stencil. The controller has a computer-readable medium containing instructions to perform any one of the above-mentioned methods. In one aspect of this embodiment, the heater can include an infrared light source, a laser source, or a gas source. In another aspect of this embodiment, the heater can be movable relative to the stencil, such as movable laterally over the top surface of the stencil. Moreover, the heater can include elements that are stationary, such as heating elements that are positioned in the workpiece holder or in the stencil. In another aspect of this embodiment, the machine can also include a wiper to force solder paste into the apertures in the stencil.

In another embodiment, a stenciling machine includes a stencil having a plurality of holes and a moveable wiper configured to move a mass of solder paste across the stencil. The moveable wiper is also configured to press discrete portions of the mass of solder paste into the holes and onto the microelectronic workpiece. The machine further includes a heating means for reflowing the discrete portions of solder paste in the plurality holes and on the microelectronic workpiece.

DETAILED DESCRIPTION

The following description is directed toward microelectronic workpieces and methods for forming solder balls on microelectronic workpieces. The term "microelectronic workpiece" is used throughout to include substrates upon which and/or in which microelectronic devices, micromechanical devices, data storage elements, and other features are fabricated. For example, microelectronic workpieces can be semiconductor wafers, glass substrates, insulative substrates, or many other types of substrates. Many specific details of several embodiments of the invention are described below with reference to microelectronic workpieces having microelectronic dies and in some applications redistribution layers to provide a thorough understanding of such embodiments. Those of ordinary skill in the art will thus understand that the invention may have other embodiments with additional elements or without several of the elements described in this section.

A. Environment

Figure 1A:
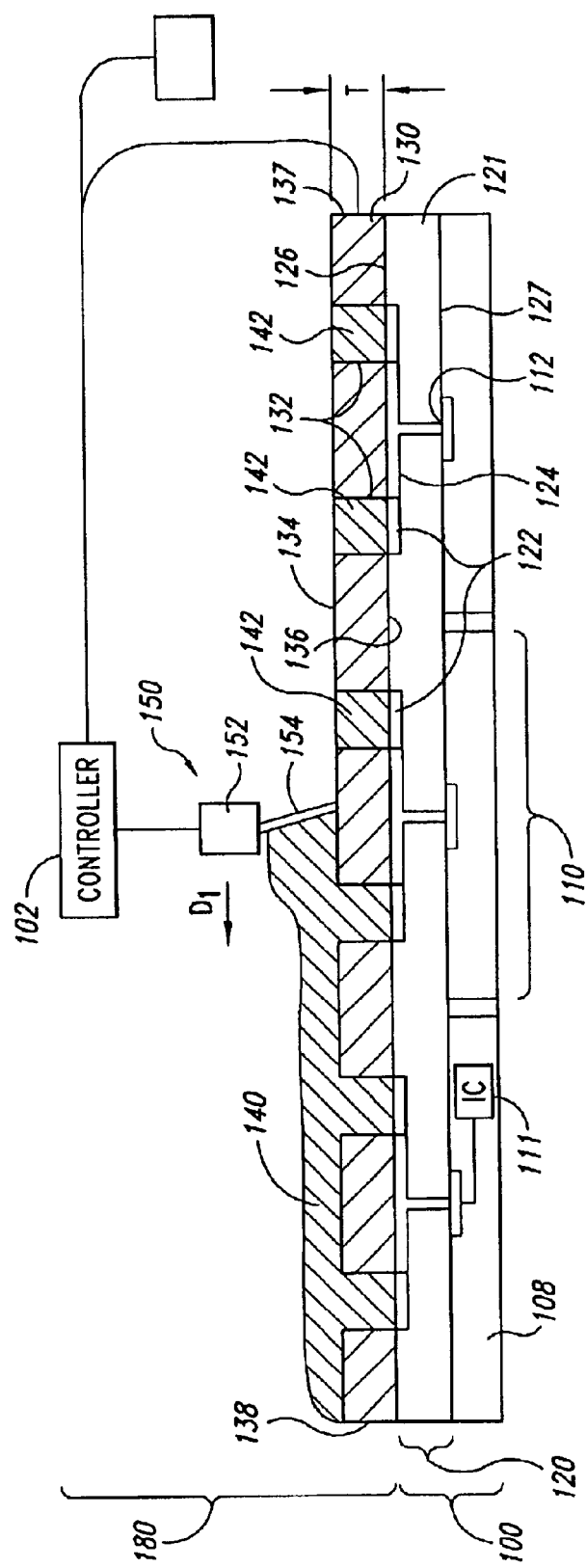
FIG. 1A is a schematic cross-sectional view of a stenciling machine depositing solder paste onto a microelectronic workpiece in accordance with one embodiment of the invention.

FIG. 1A is a schematic cross-sectional view of a stenciling machine 180 for depositing solder paste 140 onto a microelectronic workpiece 100 in accordance with one embodiment of the invention. The microelectronic workpiece 100 can include a substrate 108 having a plurality of microelectronic devices and a redistribution layer 120 formed on the substrate 108. In the illustrated embodiment, the microelectronic devices are microelectronic dies 110. Each microelectronic die 110 can have an integrated circuit 111 (shown schematically) and a plurality of bond-pads 112 coupled to the integrated circuit 111. The redistribution layer 120 provides an array of ball-pads for coupling the bond-pads 112 on the microelectronic die 110 to another type of device such as a printed circuit board. The redistribution layer 120 has a dielectric layer 121 with a first surface 126 facing away from the dies 110 and a second surface 127 adjacent to the dies 110. The redistribution layer 120 also has a plurality of ball-pads 122 and a plurality of traces 124 in or on the dielectric layer 121. The ball-pads 122 are arranged in ball-pad arrays relative to the dies 110 such that each die 110 has a corresponding array of ball-pads 122. The traces 124 couple the bond-pads 112 on the microelectronic dies 110 to corresponding ball-pads 122 in the ball-pad arrays.

The stenciling machine 180 in the illustrated embodiment includes a stencil 130, a wiper assembly 150, and a controller 102 operatively coupled to the stencil 130 and the wiper assembly 150. The stencil 130 has a plurality of apertures 132 arranged in a pattern to correspond to the ball-pads 122 on the microelectronic workpiece 100. More specifically, each aperture 132 in the stencil 130 is arranged so as to align with a particular ball-pad 122 in the redistribution layer 120. The stencil 130 also includes a first surface 134, a second surface 136 opposite the first surface 134, a first end 137, and a second end 138 opposite the first end 137. The stencil 130 has a thickness T from the first surface 134 to the second surface 136 that corresponds with a desired thickness of a solder paste brick on each ball-pad. The wiper assembly 150 can include an actuator 152 and a blade 154 coupled to the actuator 152. In the illustrated embodiment, the actuator 152 moves the blade 154 across the stencil 130 from the first end 137 to the second end 138 to drive a solder paste 140 into the apertures 132. In other embodiments, other stenciling machines can be used, such as machines that use print heads or pins to deposit the solder paste into apertures in a stencil.

B. Depositing Solder Paste

In operation, the controller 102 moves the microelectronic workpiece 100 to press the first surface 126 of the redistribution layer 120 against the second surface 136 of the stencil 130. Each aperture 132 in the stencil 130 is positioned over a corresponding ball-pad 122 on the microelectronic workpiece 100. A large volume of the solder paste 140 is on the first surface 134 at the first end 137 of the stencil 130. Next, the wiper assembly 150 moves across the first surface 134 of the stencil 130 in a direction $D_1$ from the first end 137 to the second end 138. The wiper blade 154 presses a portion of solder paste 140 into the apertures 132 to form solder paste bricks 142 on the ball-pads 122. The wiper 154 sweeps the remaining solder paste 140 to the second end 138 of the stencil 130.

C. Forming Solder Balls

Figure 1B:
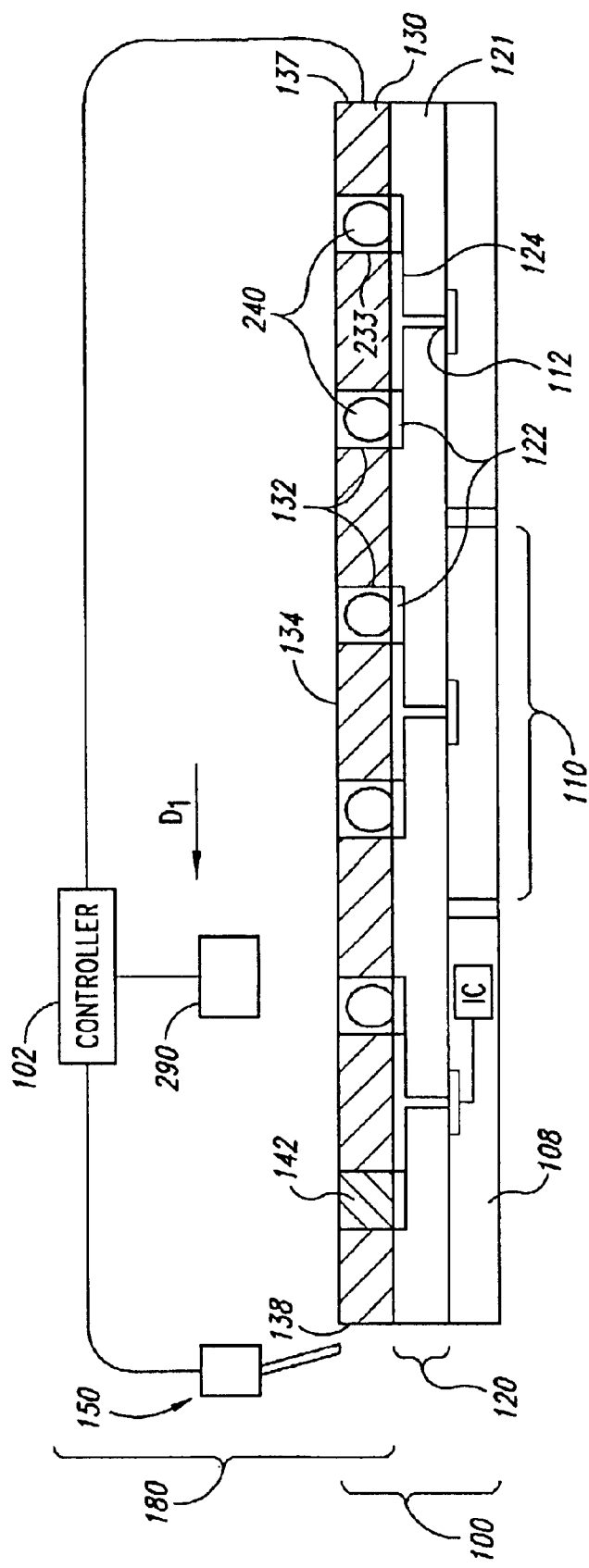
FIG. 1B is a schematic cross-sectional view of the stenciling machine of FIG. 1A having a heat source in accordance with one embodiment of the invention.

FIG. 1B is a schematic cross-sectional view of the stenciling machine 180 of FIG. 1A having a heat source 290 in accordance with one embodiment of the invention. The heat source 290 is operatively coupled to the controller 102 to reflow the solder paste 140 in the apertures 132 of the stencil 130 before separating the stencil 130 from the workpiece 100. In the illustrated embodiment, the heat source 290 moves laterally in the direction $D_1$ across the stencil 130 over the first surface 134 from the first end 137 to the second end 138. As the heat source 290 moves over each aperture 132, the solder paste 140 is reflowed in the aperture 132. More specifically, the heat source 290 heats the solder paste 140, vaporizes the flux, and melts the solder. In one aspect of this embodiment, the heat source 290 heats the solder to at least approximately 200° C. In other embodiments, the heat source 290 heats and melts the solder at a temperature less than 200° C. The molten solder naturally forms into spherically shaped balls on the ball-pads 122 of the microelectronic workpiece 100 because of the surface tension of the molten solder. After the heat source 290 moves past the apertures 132, the molten solder cools and solidifies into solder balls 240. The wetting characteristics between the molten solder and the ball-pads 122 causes the solder balls 240 to form on top of the ball-pads 122 creating a mechanical and electrical connection between the solder balls 240 and the ball-pads 122.

In one embodiment, the stencil 130 can be made of a nonwettable material, such as Kapton® manufactured by DuPont, so that the molten solder does not stick to the sidewalls 233 of the apertures 132. The non-wetting aspect of the stencil 130 further forces the molten solder into sphere-like balls or other solder elements on top of the ball-pads 122. The particular material for the stencil, therefore, should be selected so that the stencil resists wetting by a liquid state of the solder material. As such, materials other than Kapton® can be used for the stencil, such as any material that repels the liquid state of the solder material.

In other embodiments, the heat source 290 can follow the wiper assembly 150 (FIG. 1A) as it moves from the first end 137 of the stencil 130 to the second end 138, or the heat source 290 can be stationary relative to the stencil 130. In any of the foregoing embodiments, the heat source 290 can be a laser, an infrared light, a radiating element or other suitable heat sources. In other embodiments, the heat source 290 can heat the solder paste 140 by convection, such as by blowing a hot gas onto the solder paste 140.

Figure 1C:
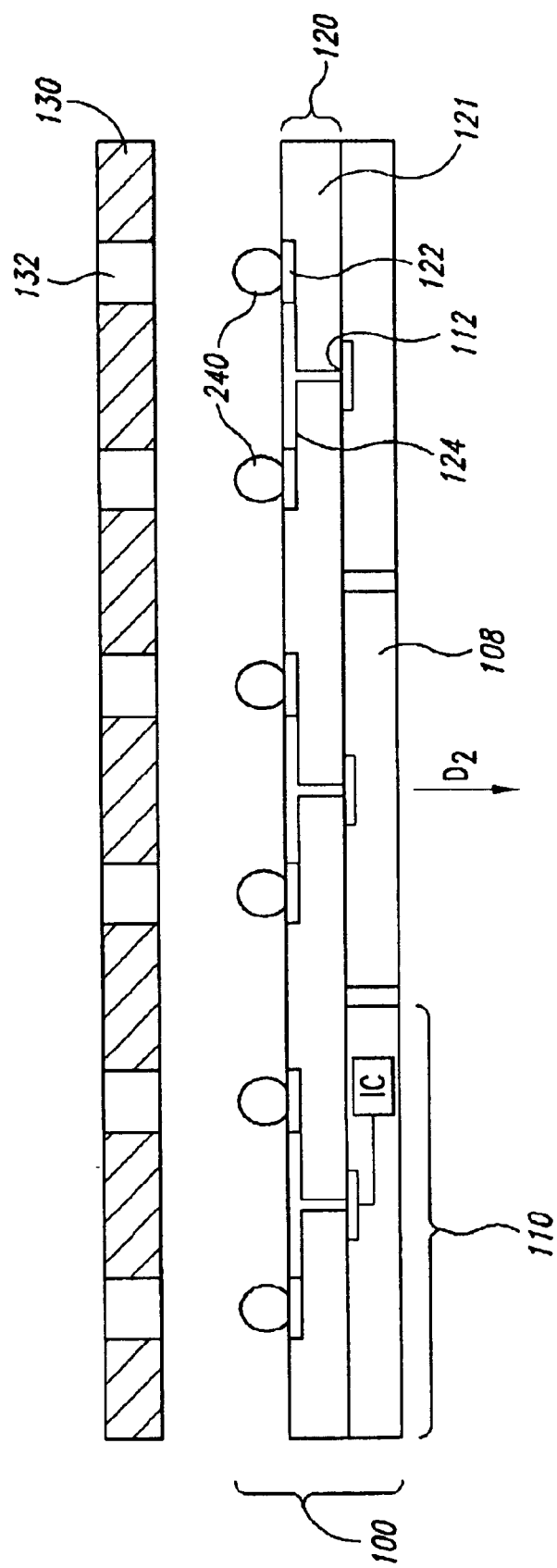
FIG. 1C is a schematic cross-sectional view of the microelectronic workpiece including the attached solder balls after removing the stencil.

FIG. 1C is a schematic cross-sectional view of the microelectronic workpiece 100 including the attached solder balls 240 after separating the workpiece 100 from the stencil 130. After the solder balls 240 are formed on the ball-pads 122 in the reflow process, the microelectronic workpiece 100 is moved in a direction $D_2$ and released by the stencil 130. Alternatively, the stencil 130 can be raised relative to the workpiece 100. In either circumstance, the solder-balls 240 remain on the ball-pads 122 because the cross-sectional dimension of the solder-balls 240 is less than that of the apertures 132 in the stencil 130. The solder-balls 240 are smaller than the apertures 132 because the flux in the solder paste bricks 142 (FIG. 1A) vaporizes during the reflow stage.

One advantage of the illustrated embodiments is that reflowing the solder paste 140 before disengaging the microelectronic workpiece 100 from the stencil 130 eliminates the problems that occur when residual solder paste remains in the apertures 132 of the stencil 130. In the illustrated embodiments, no residual solder paste remains in the stencil 130 after reflow because the stencil 130 repels the molten solder, the reflow process reduces the volume of the solder by vaporizing the flux, and the molten solder naturally forms into the solder elements. Moreover, the solder-balls 240 are typically allowed to harden and adhere to the ball-pads 122 before the microelectronic workpiece 100 is separated from the stencil 130. As such, neither the solder paste bricks 142 nor the solder-balls 240 remain attached to the stencil 130 after separating the stencil 130 from the workpiece 100.

Another advantage of the illustrated embodiments is that solder paste bricks 142 will not be smeared or bridged on the workpiece 100. In the illustrated embodiment, the solder paste 140 is formed into hardened solder balls 240 before the microelectronic workpiece 100 is removed from the stencil 130. As such, no smearing or bridging occurs on the workpiece 100. A further advantage of the illustrated embodiments is that stencil machines and reflow equipment are combined in a single machine to reduce the floor space for forming solder balls.

D. Alternate Embodiments

Figure 2:
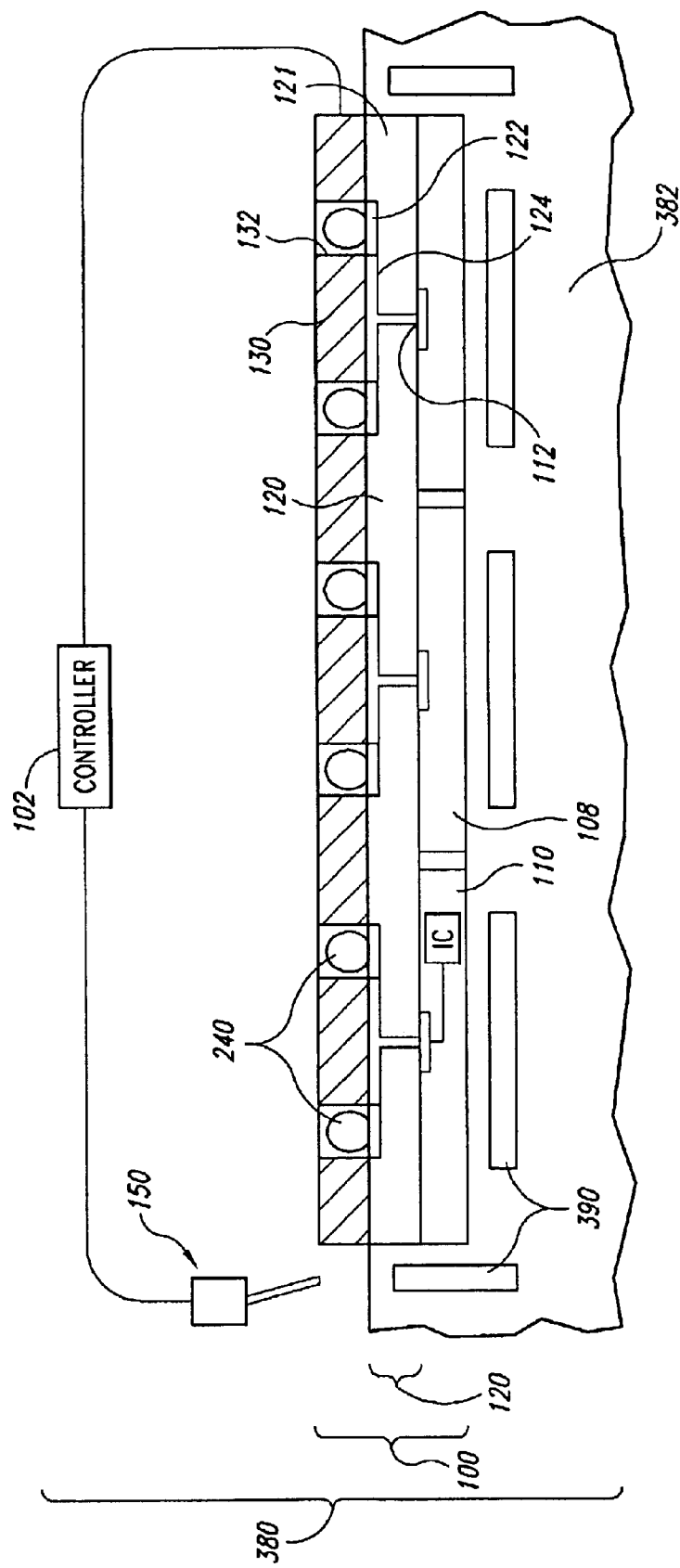
FIG. 2 is a schematic cross-sectional view of a stenciling machine having a heat source in accordance with another embodiment of the invention.

FIG. 2 is a schematic cross-sectional view of a stenciling machine 380 having a heat source in accordance with another embodiment of the invention. The stenciling machine 380 can include the controller 102, the stencil 130, and the wiper assembly 150 described above with reference to FIG. 1A. The stenciling machine 380 of the illustrated embodiment also includes a workpiece holder 382 having a plurality of heating elements 390. The workpiece holder 382 is operatively coupled to the controller 102 and configured to secure the microelectronic workpiece 100 during the deposition and reflow of the solder paste. The heating elements 390 are positioned in the workpiece holder 382 proximate to the microelectronic workpiece 100 to heat and reflow the solder paste in the apertures 132 of the stencil 130. The heating elements 390 heat the microelectronic dies 110, which in turn heat the ball-pads 122 of the redistribution layer 120. The heat is transferred from the ball-pads 122 to the solder paste to reflow the solder paste and form the solder balls 240. The heating elements 390 can be resistance heaters, heat exchangers, or other devices to heat the workpiece holder 382.

Figure 3:
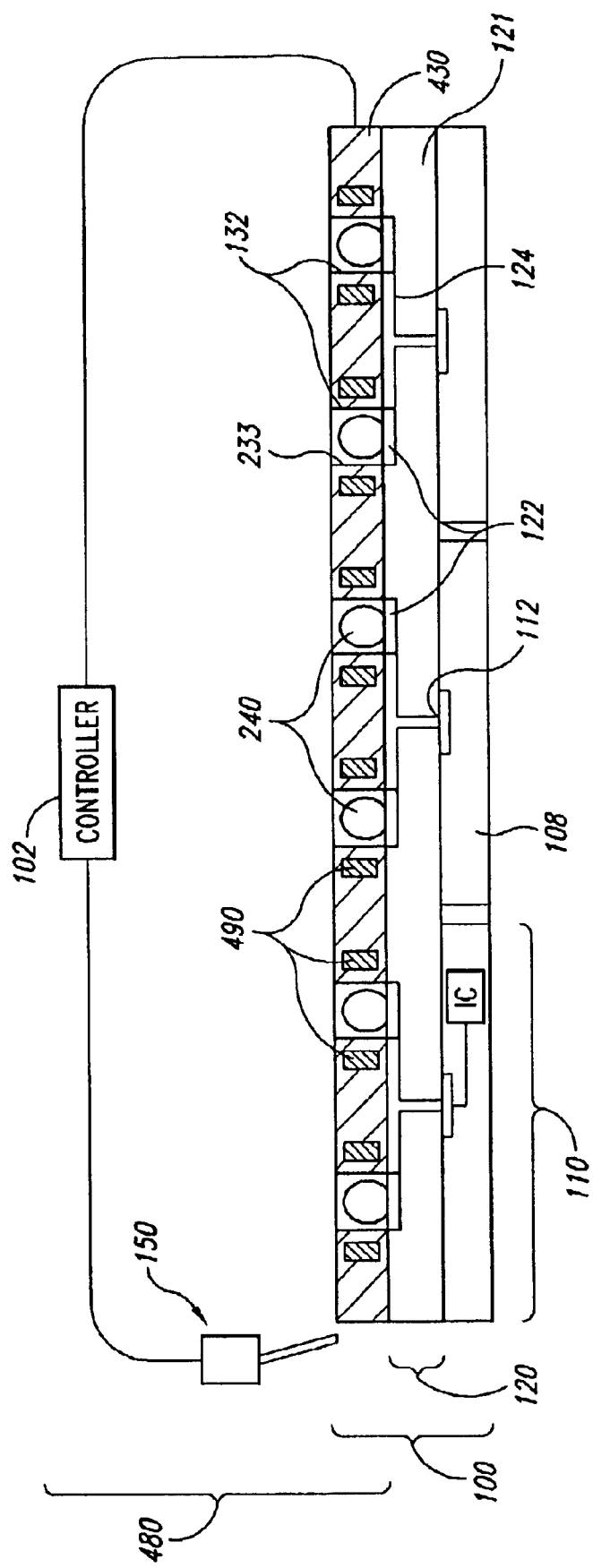
FIG. 3 is a schematic cross-sectional view of a stenciling machine having a heat source in accordance with yet another embodiment of the invention.

FIG. 3 is a schematic cross-sectional view of a stenciling machine 480 having a heat source in accordance with another embodiment of the invention. The stenciling machine 480 can include the controller 102 and the wiper assembly 150 described above with reference to FIG. 1A. The stenciling machine 480 of the illustrated embodiment also includes a stencil 430 having a plurality of apertures 132 and a plurality of heating elements 490 positioned proximate to the apertures 132 to reflow the solder paste 140. Heat is transferred from the heating elements 490 to the solder paste through the sidewalls 233 of the apertures 132 by conduction and convection to reflow the solder paste and form solder balls 240 on the microelectronic workpiece 100.

Figure 4:
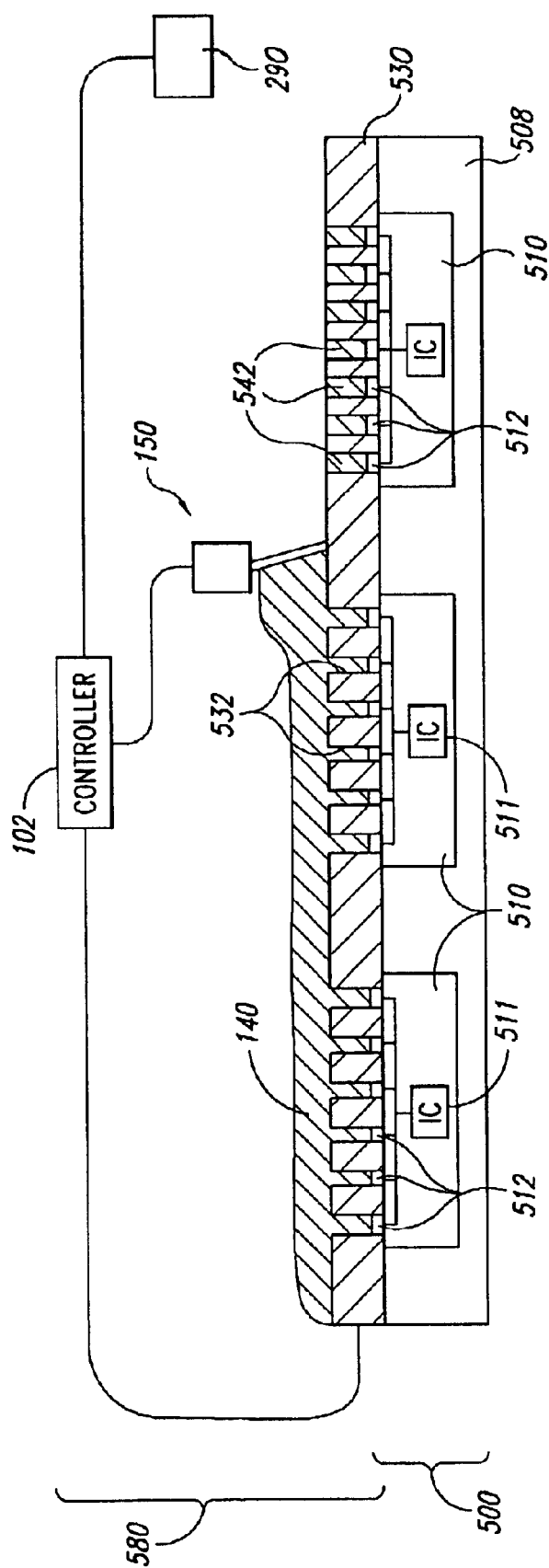
FIG. 4 is a schematic cross-sectional view of a stenciling machine depositing solder paste onto a microelectronic workpiece in accordance with another embodiment of the invention.

FIG. 4 is a schematic cross-sectional view of a stenciling machine 580 for depositing solder paste 140 onto a microelectronic workpiece 500 in accordance with another embodiment of the invention. The microelectronic workpiece 500 can include a substrate 508 having a plurality of microelectronic dies 510 which can be similar to the microelectronic dies 110 described above with reference to FIGS. 1A–3. For example, each microelectronic die 510 can have an integrated circuit 511 (shown schematically) and a plurality of bond-pads 512 electrically coupled to the integrated circuit 511.

The stenciling machine 580 of the illustrated embodiment can include the controller 102, the wiper assembly 150, and the heat source 290 described above with reference to FIGS. 1A–1C. In other embodiments, other heat sources can be used, such as those described in FIGS. 2–3. The stenciling machine 580 also includes a stencil 530 having a plurality of apertures 532 arranged in a pattern to correspond to the bond-pads 512 of the microelectronic workpiece 500. In operation, the wiper assembly 150 of the stenciling machine 580 presses a portion of the solder paste 140 into the apertures 532 of the stencil 530 to form solder paste bricks 542 on the bond-pads 512. Next, the heat source 290 can move over each aperture 532 to reflow the solder paste bricks 542 and form solder balls on the bond-pads 512.

One advantage of the illustrated embodiments is that forming solder balls within the apertures of the stencil allows the microelectronic workpiece to have a fine pitch between the bond-pads or ball-pads. A fine pitch is permitted because the stencil separates the solder paste bricks on adjacent bond-pads or ball-pads and thus prevents smearing and bridging between the adjacent bricks before and during reflow. Accordingly, the fine pitch between the bond-pads or ball-pads of the microelectronic workpiece reduces the size of the microelectronic devices formed from the workpiece.

Figure 5:
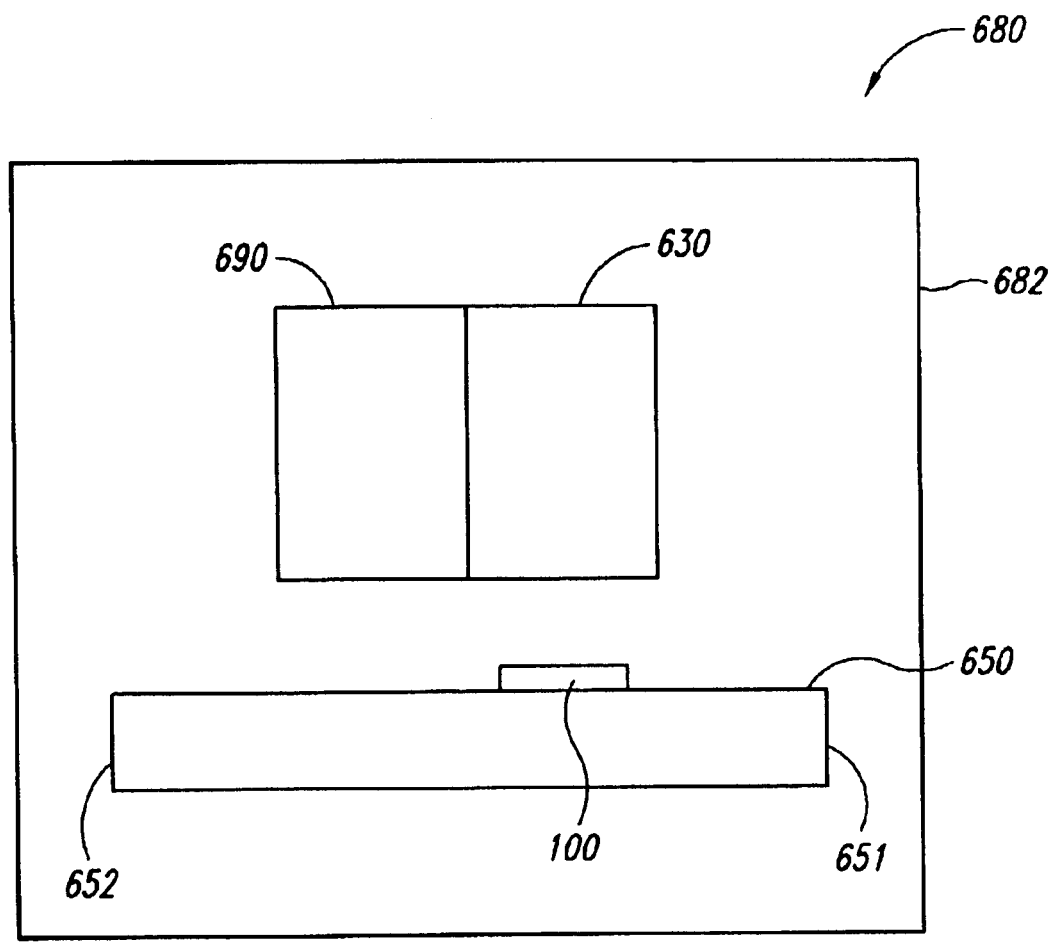
FIG. 5 is a schematic view of a stenciling machine in accordance with another embodiment of the invention.

FIG. 5 is a schematic view of a stenciling machine 680 in accordance with another embodiment of the invention. The stenciling machine 680 includes a housing 682, a stencil 630 in the housing 680, and a heat source 690 in the housing 680. The stencil 630 and the heat source 690 can be similar or identical to any one the stencils 130 and 430 and the heat sources 290, 390 and 490 described above with reference to FIGS. 1A–4. For example, the stencil 630 can have a plurality of apertures arranged to align over the ball-pads of the microelectronic workpiece 100, and the heat source 690 can heat and melt the solder paste bricks within the apertures of the stencil 630 to produce spherically shaped balls on the ball-pads of the microelectronic workpiece 100. In other embodiments, the solder balls can be formed on the bond-pads of the microelectronic workpiece 500 described above with reference to FIG. 4. In the illustrated embodiment, the stencil machine 680 also includes a conveyor 650 having a first end 651 and a second end 652 opposite the first end 651 to move the microelectronic workpiece 100 within the housing 682 to and from the stencil 630 and the heat source 690. In other embodiments of the invention, the housing 682 may not include the conveyor 650.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

What is claimed is:

1. A method for depositing and reflowing solder paste on a microelectronic workpiece having a plurality of microelectronic dies with an integrated circuit, the method comprising:

positioning a stencil having a plurality of apertures at least proximate to the workpiece;

placing discrete masses of solder paste into the plurality of apertures; and reflowing the discrete masses of solder paste while the stencil is positioned at least proximate to the workpiece and while the discrete masses are in the apertures;

wherein reflowing the discrete masses of solder paste comprises moving a heat source over the discrete masses of solder paste while the stencil is positioned at least proximate to the workpiece.

2. The method of claim 1, further comprising separating the microelectronic workpiece from the stencil after reflowing the solder paste.

3. The method of claim 1 wherein placing discrete masses of solder paste comprises wiping solder paste across the stencil in a first direction to press a portion of the solder paste through the plurality of apertures.

4. The method of claim 1 wherein reflowing the discrete masses of solder paste comprises:

heating the discrete masses of solder paste in the plurality of apertures in the stencil; and forming solder balls on pads electrically coupled to one of the integrated circuits.

5. The method of claim 4 wherein the pads comprise bond-pads of the microelectronic dies.

6. The method of claim 4 wherein the microelectronic workpiece further comprises a redistribution layer with a dielectric layer over the dies, and wherein the pads comprise ball-pads in and/or on the redistribution layer.

7. The method of claim 1 wherein:

placing the discrete masses of solder paste comprises depositing solder paste bricks onto pads electrically coupled to one of the dies; and reflowing the discrete masses of solder paste comprises forming solder balls on the pads.

8. The method of claim 1 wherein:

positioning the stencil comprises positioning each aperture in the plurality of apertures over a corresponding pad electrically coupled to one of the dies; and reflowing the discrete masses of solder paste comprises forming solder balls on the pads.

9. The method of claim 1 wherein reflowing the discrete masses of solder paste further comprises heating the discrete masses of solder paste with infrared light while the stencil is positioned at least proximate to the workpiece.

10. The method of claim 1 wherein reflowing the discrete masses of solder paste further comprises heating the discrete masses of solder paste with a laser while the stencil is positioned at least proximate to the workpiece.

11. The method of claim 1 wherein reflowing the discrete masses of solder paste further comprises heating the discrete masses of solder paste with heating elements in a microelectronic workpiece holder while the stencil is positioned at least proximate to the workpiece.

12. The method of claim 1 wherein reflowing the discrete masses of solder paste further comprises heating the discrete masses of solder paste through convection while the stencil is positioned at least proximate to the workpiece.

13. The method of claim 1 wherein reflowing the discrete masses of solder paste further comprises heating the discrete masses of solder paste with a plurality of heating elements in the stencil while the stencil is positioned at least proximate to the workpiece.

14. A method for forming solder balls on a microelectronic workpiece having a plurality of dies, comprising:

placing solder paste into a plurality of apertures in a stencil, the apertures being aligned with corresponding pads electrically coupled to one of the dies; and forming solder balls within the plurality of apertures and on the pads of the microelectronic workpiece;

wherein the microelectronic workpiece further comprises a redistribution layer with a dielectric layer over the dies, and wherein the pads comprise ball-pads in and/or on the redistribution layer.

15. The method of claim 14 wherein forming solder balls comprises heating the solder paste in the plurality of apertures in the stencil.

16. The method of claim 14 wherein forming solder balls comprises reflowing the solder paste in the plurality of apertures in the stencil.

17. The method of claim 14 wherein:
placing solder paste comprises depositing solder paste into the plurality of apertures at least proximate to the microelectronic workpiece; and
forming solder balls comprises reflowing the solder paste in the plurality of apertures in the stencil.

18. The method of claim 14 wherein forming solder balls comprises heating the solder paste in the plurality of apertures with infrared light.

19. The method of claim 14 wherein forming solder balls comprises heating the solder paste in the plurality of apertures with a laser.

20. The method of claim 14 wherein forming solder balls comprises heating the solder paste in the plurality of apertures with a plurality of heating elements in a microelectronic workpiece holder.

21. The method of claim 14 wherein forming solder balls comprises heating the solder paste in the plurality of apertures through convection.

22. The method of claim 14 wherein forming solder balls comprises heating the solder paste in the plurality of apertures with heating elements in the stencil.

23. The method of claim 14 wherein forming solder balls comprises moving a heat source over the solder paste in the plurality of apertures.

24. The method of claim 14 further comprising separating the microelectronic workpiece from the stencil after forming the solder balls.

25. The method of claim 14 wherein placing solder paste comprises wiping solder paste across the stencil in a first direction to press discrete portions of the solder paste into the plurality of apertures.

26. A method for depositing and reflowing solder paste on a microelectronic workpiece, comprising:
depositing solder paste into a plurality of apertures in a stencil and onto pads of the microelectronic workpiece; and
reflowing the solder paste within the plurality of apertures in the stencil;
wherein depositing solder paste comprises placing solder paste bricks onto ball-pads on a redistribution layer of the microelectronic workpiece; and
wherein reflowing the solder paste comprises forming solder balls on the ball-pads.

27. The method of claim 26 wherein reflowing the solder paste comprises heating the solder paste in the plurality of apertures in the stencil.

28. The method of claim 26 wherein reflowing the solder paste comprises heating the solder paste in the plurality of apertures with infrared light.

29. The method of claim 26 wherein reflowing the solder paste comprises heating the solder paste in the plurality of apertures with a laser.

30. The method of claim 26 wherein reflowing the solder paste comprises heating the solder paste in the plurality of apertures with heating elements in the stencil.

31. The method of claim 26 wherein reflowing the solder paste comprises heating the solder paste in the plurality of apertures with heating elements in a microelectronic workpiece holder.

32. The method of claim 26 wherein reflowing the solder paste comprises moving a heat source over the solder paste in the plurality of apertures.

33. The method of claim 26 wherein reflowing the solder paste comprises heating the solder paste in the plurality of apertures through convection.

34. A method for depositing and reflowing solder paste on a microelectronic workpiece having a plurality of dies and a redistribution layer with ball-pads electrically coupled to the dies, comprising:
wiping solder paste across a stencil in a first direction to press discrete portions of the solder paste into corresponding holes in the stencil and onto the ball-pads of the redistribution layer of the microelectronic workpiece; and
reflowing the solder paste in the holes of the stencil to form solder balls on the ball-pads of the microelectronic workpiece.

35. The method of claim 34 wherein reflowing the solder paste comprises heating the solder paste in the holes.

36. The method of claim 34 wherein reflowing the solder paste comprises heating the solder paste in the holes with infrared light.

37. The method of claim 34 wherein reflowing the solder paste comprises heating the solder paste in the holes with a laser.

38. The method of claim 34 wherein reflowing the solder paste comprises heating the solder paste in the holes with heating elements in a microelectronic workpiece holder.

39. The method of claim 34 wherein reflowing the solder paste comprises moving a heat source over the solder paste in the holes.

40. The method of claim 34 further comprising separating the microelectronic workpiece from the stencil after reflowing the solder paste.

41. A method for depositing and reflowing solder paste on a microelectronic workpiece having a plurality of dies with bond-pads and a redistribution layer with ball-pads electrically coupled to the bond-pads on the dies, the method comprising:
positioning a stencil having a plurality of apertures in a first position at least proximate to the redistribution layer with each aperture over, a corresponding ball-pad;
depositing discrete masses of solder paste onto the ball-pads through the plurality of apertures while the stencil is in the first position; and
reflowing the discrete masses of solder paste while the stencil is in the first position.

42. The method of claim 41 wherein reflowing the solder paste comprises forming solder balls on the ball-pads in the plurality of apertures.

43. The method of claim 41 wherein reflowing the solder paste comprises heating the solder paste in the plurality of apertures with a laser.

44. The method of claim 41 wherein reflowing the solder paste comprises heating the solder paste in the plurality of apertures with infrared light.

45. The method of claim 41 wherein reflowing the solder paste comprises moving a heat source over the solder paste in the plurality of apertures.

46. A method for depositing and reflowing solder paste on a microelectronic workpiece having a plurality of dies with an integrated circuit and bond-pads electrically coupled to the integrated circuit, comprising:

depositing solder paste into a plurality of apertures in a stencil and onto the bond-pads; and reflowing the solder paste within the plurality of apertures in the stencil;

wherein reflowing the solder paste comprises heating the solder paste in the plurality of apertures with heating elements in the stencil.

47. The method of claim 46 wherein reflowing the solder paste comprises forming solder balls onto the bond-pads of the microelectronic workpiece and within the plurality of apertures.

48. The method of claim 46 wherein:

depositing solder paste comprises placing solder paste bricks onto corresponding bond-pads of the microelectronic workpiece; and reflowing the solder paste comprises forming solder balls on the bond-pads.

49. The method of claim 46 wherein reflowing the solder paste further comprises heating the solder paste in the plurality of apertures with infrared light.

50. The method of claim 46 wherein reflowing the solder paste further comprises heating the solder paste in the plurality of apertures with a laser.

51. The method of claim 46 wherein reflowing the solder paste further comprises heating the solder paste in the plurality of apertures with heating elements in a microelectronic workpiece holder.

52. The method of claim 46 wherein reflowing the solder paste further comprises moving a heat source over the solder paste in the plurality of apertures.

53. The method of claim 46 wherein reflowing the solder paste further comprises heating the solder paste in the plurality of apertures through convection.

54. A method for depositing and reflowing solder paste on a microelectronic workpiece in a stenciling machine, the method comprising:

depositing solder paste into a plurality of apertures in a stencil and onto corresponding pads of the microelectronic workpiece with the microelectronic workpiece and the stencil disposed within a housing of the stenciling machine; and reflowing the solder paste in the apertures of the stencil with the microelectronic workpiece and the stencil disposed within the housing of the stenciling wherein reflowing the solder paste comprises heating the solder paste in the apertures of the stencil with infrared light.

55. A method for depositing and reflowing solder paste on a microelectronic workpiece in a stenciling machine, the method comprising:

depositing solder caste into a plurality of apertures in a stencil and onto corresponding pads of the microelectronic workpiece with the microelectronic workpiece and the stencil disposed within a housing of the stenciling machine; and reflowing the solder paste in the apertures of the stencil with the microelectronic workpiece and the stencil disposed within the housing of the stenciling machine;

wherein reflowing the solder paste comprises heating the solder paste in the apertures of the stencil with a laser.

56. A method for depositing and reflowing solder paste on a microelectronic workpiece in a stenciling machine, the method comprising:

depositing solder paste into a plurality of apertures in a stencil and onto corresponding pads of the microelectronic workpiece with the microelectronic workpiece and the stencil disposed within a housing of the stenciling machine; and reflowing the solder paste in the apertures of the stencil with the microelectronic workpiece and the stencil disposed within the housing of the stenciling machine;

wherein reflowing the solder paste comprises heating the solder paste in the apertures of the stencil with a plurality of heating elements in the stencil.

57. A method for depositing and reflowing solder paste on a microelectronic workpiece in a stenciling machine, the method comprising:

depositing solder paste into a plurality of apertures in a stencil and onto corresponding pads of the microelectronic workpiece with the microelectronic workpiece and the stencil disposed within a housing of the stenciling machine; and reflowing the solder paste in the apertures of the stencil with the microelectronic workpiece and the stencil disposed within the housing of the stenciling machine;

wherein reflowing the solder paste comprises moving a heat source over the solder paste in the apertures of the stencil.

58. A method for depositing and reflowing solder paste on a microelectronic workpiece in a stenciling machine, the method comprising:

depositing solder paste into a plurality of apertures in a stencil and onto corresponding pads of the microelectronic workpiece with the microelectronic workpiece and the stencil disposed within a housing of the stenciling machine; and reflowing the solder paste in the apertures of the stencil with the microelectronic workpiece and the stencil disposed within the housing of the stenciling machine;

wherein reflowing the solder paste comprises heating the solder paste in the apertures of the stencil through convection.

* * * * *

UNITED STATES PATENT AND TRADEMARK OFFICE
CERTIFICATE OF CORRECTION

PATENT NO.       : 6,845,901 B2
APPLICATION NO.  : 10/226,509
DATED            : January 25, 2005
INVENTOR(S)      : Michel Koopmans It is certified that error appears in the above-identified patent and that said Letters Patent is hereby corrected as shown below:

Column 11
Line 53, "caste" should be --paste--;

Signed and Sealed this

Eighth Day of August, 2006

JON W. DUDAS
*Director of the United States Patent and Trademark Office*